(12) United States Patent
Hironaka et al.

(10) Patent No.: US 9,105,597 B2
(45) Date of Patent: Aug. 11, 2015

(54) ELECTRIC POWER CONVERTER AND METHOD OF MANUFACTURING THE SAME

(75) Inventors: Ryouji Hironaka, Gamagoori (JP); Hitoshi Imura, Chiryu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/367,868

(22) PCT Filed: Jan. 23, 2012

(86) PCT No.: PCT/JP2012/051320
§ 371 (c)(1),
(2), (4) Date: Jun. 20, 2014

(87) PCT Pub. No.: WO2013/111261
PCT Pub. Date: Aug. 1, 2013

(65) Prior Publication Data
US 2015/0123261 A1    May 7, 2015

(51) Int. Cl.
*H01L 23/367* (2006.01)
*H01L 21/52* (2006.01)
*H01L 23/40* (2006.01)

(52) U.S. Cl.
CPC .............. *H01L 23/367* (2013.01); *H01L 21/52* (2013.01); *H01L 23/3675* (2013.01); *H01L 23/40* (2013.01)

(58) Field of Classification Search
CPC ... H01L 23/367; H01L 23/3675; H01L 23/40; H01L 21/52; H02M 7/48; H02M 3/00

USPC ................................................... 257/718, 719
See application file for complete search history.

(56) References Cited

U.S. PATENT DOCUMENTS

| 4,636,917 A | * | 1/1987 | Jouanny ........................ 361/709 |
| 4,769,744 A | * | 9/1988 | Neugebauer et al. ......... 361/717 |
| 6,058,014 A | * | 5/2000 | Choudhury et al. .......... 361/704 |
| 2013/0003301 A1 | | 1/2013 | Miyamoto et al. |
| 2014/0098496 A1 | * | 4/2014 | Nakasaka ..................... 361/699 |

FOREIGN PATENT DOCUMENTS

| JP | 58139453 A | * | 8/1983 |
| JP | A-2011-167028 | | 8/2011 |
| JP | A-2011-200057 | | 10/2011 |
| JP | A-2011-211771 | | 10/2011 |
| JP | B2-5423877 | | 2/2014 |

* cited by examiner

*Primary Examiner* — Allan R Wilson
(74) *Attorney, Agent, or Firm* — Oliff PLC

(57) ABSTRACT

An electric power converter that can easily be assembled is provided. An electric power converter includes a semiconductor stacking unit, a frame and a spring unit. The semiconductor stacking unit has a configuration in which the semiconductor modules and coolers are stacked. The spring unit is inserted between one end of the semiconductor stacking unit in a stacking direction, and a support provided on the frame, and fixes the semiconductor stacking unit while applying pressure thereto. The spring unit is provided with a first plate, a second plate, and a coil spring sandwiched between the first and second plates. A recess is provided in the first plate so as to have a gap between the first plate and the end surface of the semiconductor stacking unit. A penetrating passage through which the entire spring unit passes along a bottom of the recess is provided in the spring unit.

4 Claims, 10 Drawing Sheets

ELECTRIC POWER CONVERTER AND METHOD OF MANUFACTURING THE SAME

TECHNICAL FIELD

The technique disclosed in the present specification relates to an electric power converter such as an inverter or converter, and a method of manufacturing the same.

BACKGROUND ART

In an inverter which supplies power to a motor or in a voltage converter which converts voltage, a structure may be adopted in which a semiconductor element which generates a large amount of heat, such as an IGBT, is integrated separately from other circuits, and is cooled intensively. In one such integrated structure, a semiconductor stacking unit is known in which a flat type semiconductor module for containing a semiconductor element, and a flat type cooler are stacked alternately (e.g., Patent Document 1 to Patent Document 3).

In order to transfer heat well from the semiconductor module to the cooler, the semiconductor stacking unit is placed on a frame while pressure is being applied to the semiconductor stacking unit in a stacking direction. Here, the frame is a structure for supporting the semiconductor module, and typically may be a housing of the electric power converter. In order to apply pressure to the semiconductor module, a spring is fitted between one end surface of the semiconductor module in the stacking direction and a wall or support provided on the frame. A technique for improving the efficiency of an operation for inserting a compressed spring between the wall or support of the frame and the semiconductor module is disclosed in Patent Document 1 to Patent Document 3.

Patent Document 1 discloses a technique in which, after compressing a clip-shaped flat spring, the clip is inserted between a semiconductor module and a wall of a frame. The techniques of Patent Document 2 and Patent Document 3 both employ a spring unit in which a coil spring is sandwiched between two plates. The technique disclosed in Patent Document 2 is as follows. The spring unit is inserted from a slit provided in a wall of a frame, and the spring unit is compressed while its front side plate is pressing against the semiconductor stacking unit. When a rear side plate has passed through the slit, the rear side plate is rotated by 90 degrees. When the pushing force on the rear side plate is released, both ends of the rear side plate engage with both sides of the slit and the spring unit applies pressure to the semiconductor stacking unit, thus fixing the semiconductor stacking unit. The technique of Patent Document 3 is as follows. A bolt is inserted from a rear end plate while the spring unit is in a compressed state, and the bolt is engaged in a screw hole provided in a rear surface of a front side plate. Thus, a spring unit which is held in a compressed state can be obtained. The spring unit which is held in the compressed state is placed between a semiconductor stacking unit and a wall of a frame. A rear side plate of the spring unit is fixed to the frame. Next, the bolt is disengaged. Upon disengagement of the bolt, the spring is released, and the spring unit applies load to the semiconductor stacking unit, fixing the semiconductor stacking unit.

CITATION LIST

Patent Document

[Patent Document 1] JP Patent Application Publication No, 2011-167028

[Patent Document 2] JP Patent Application Publication No. 2011-200057

[Patent Document 3] JP Patent Application Publication No 2011-211771

SUMMARY OF INVENTION

Although the spring unit facilitates an assembly operation of the semiconductor stacking unit, the techniques of Patent Documents 2 and 3 may still be in need of further improvement. For example, since the rear side plate of the spring unit is rotated while the spring unit is being pressed against the semiconductor stacking unit in the technique of Patent Document 2, twisting force may possibly be applied to the semiconductor stacking unit, and that while the rear side plate is being rotated and after the compression of the spring unit, the pressure applied to the semiconductor stacking unit may not be uniform. If the pressure applied to the semiconductor stacking unit is not uniform, adhesion of the cooler and the semiconductor module may possibly be reduced. Further, since a bolt is used in the technique of Patent Document 3, dust may possibly be generated when the bolt is disengaged from the screw hole, thus contaminating the semiconductor stacking unit. The techniques disclosed in Patent Documents 2 and 3 need to take these issues into consideration. Assembly performance is not high. The present specification provides a technique for improving, compared to the prior art, the assembly performance of an electric power converter.

One aspect of the technique taught in the present specification provides an electric power converter. The electric power converter comprises a semiconductor stacking unit, a frame for placing the semiconductor stacking unit, and as spring unit. The semiconductor stacking unit is a structure in which a flat type semiconductor module and a flat type cooler are stacked alternately. The semiconductor module contains a semiconductor element. Facing walls or supports may be provided on the frame. The semiconductor stacking unit may be fixed between the walls or the supports by using the spring unit. The spring unit is substantially configured by first and second plates and a spring sandwiched between the first and second plates. The first plate is a plate that contacts with an end surface of the semiconductor stacking unit. The first plate has a recess which forms a gap between the end surface of the semiconductor stacking unit and the first plate. The second plate is a plate that contacts with the wall or support provided on the frame. The semiconductor stacking unit is placed between the facing walls or supports of the frame, and the spring unit is inserted between one end of the semiconductor stacking unit in a stacking direction, and the wall or the support provided on the frame. The semiconductor stacking unit is fixed while being pressed by the spring unit. As described above, the frame may be a housing for containing the semiconductor stacking unit. Further, it is preferred that the spring is a coil spring, but is not limited to being a coil spring. A frame may be provided with a wall and a support facing each other, and the semiconductor stacking unit may be fixed between the wall and the support.

The above described electric power converter is assembled by the following steps. First, a lock pin having a hook at a tip of the lock pin is inserted into a penetrating passage from a second plate side, compressing the spring unit. Moreover, the lock, pin has a flange (stopper) part-way along, and this flange pushes the second plate. After the tip of the lock pin has passed through an opening of the penetrating passage of the first plate, the hook of the lock pin engages an edge of the opening of the penetrating passage of the first plate, thus holding the spring unit in a compressed state. That is, the spring unit is compressed between the flame and the hook of the lock pin. Next, the semiconductor stacking unit is placed on the frame, and the spring unit which is held in the compressed state is placed between the wall or support of the frame and the end surface of the semiconductor stacking unit. Finally, the lock pin is disengaged, releasing the spring unit, applying pressure to the semiconductor stacking unit, and fixing the semiconductor stacking unit.

In the novel electric power converter disclosed in the present specification, the spring unit having the penetrating passage which is open to the bottom of the recess of the first plate improves the assembly performance of the electric power converter. The lock pin which is passed through from the second plate side compresses the spring, and the hook at the tip of the lock pin engages the first plate. The lock pin easily causes the spring unit to be in the compressed state. The tip of the lock pin that includes the hook is disposed in the recess of the first plate. Therefore, the first plate can make contact with the end surface of the semiconductor stacking unit without the tip of the lock pin interfering. When the lock pin is disengaged, the first plate applies pressure uniformly to the semiconductor stacking unit. Further, unlike the bolt of Patent Document 3, the lock pin having the hook on the tip does not require a screw hole, and does not generate dust. The technique described above improves the assembly performance of the electric power converter.

The novel electric power converter disclosed in the present specification is a device comprising a stacked type semiconductor stacking unit, and is e.g., an inverter that supplies power to a motor. According to the technique disclosed in the present specification, the spring unit that supports the semiconductor stacking unit while applying pressure to the semiconductor stacking unit can be attached easily and without generating dust. Details of and further improvements to the technique disclosed in the present specification are described in the embodiment of the invention.

DESCRIPTION OF EMBODIMENTS

Figure 1:
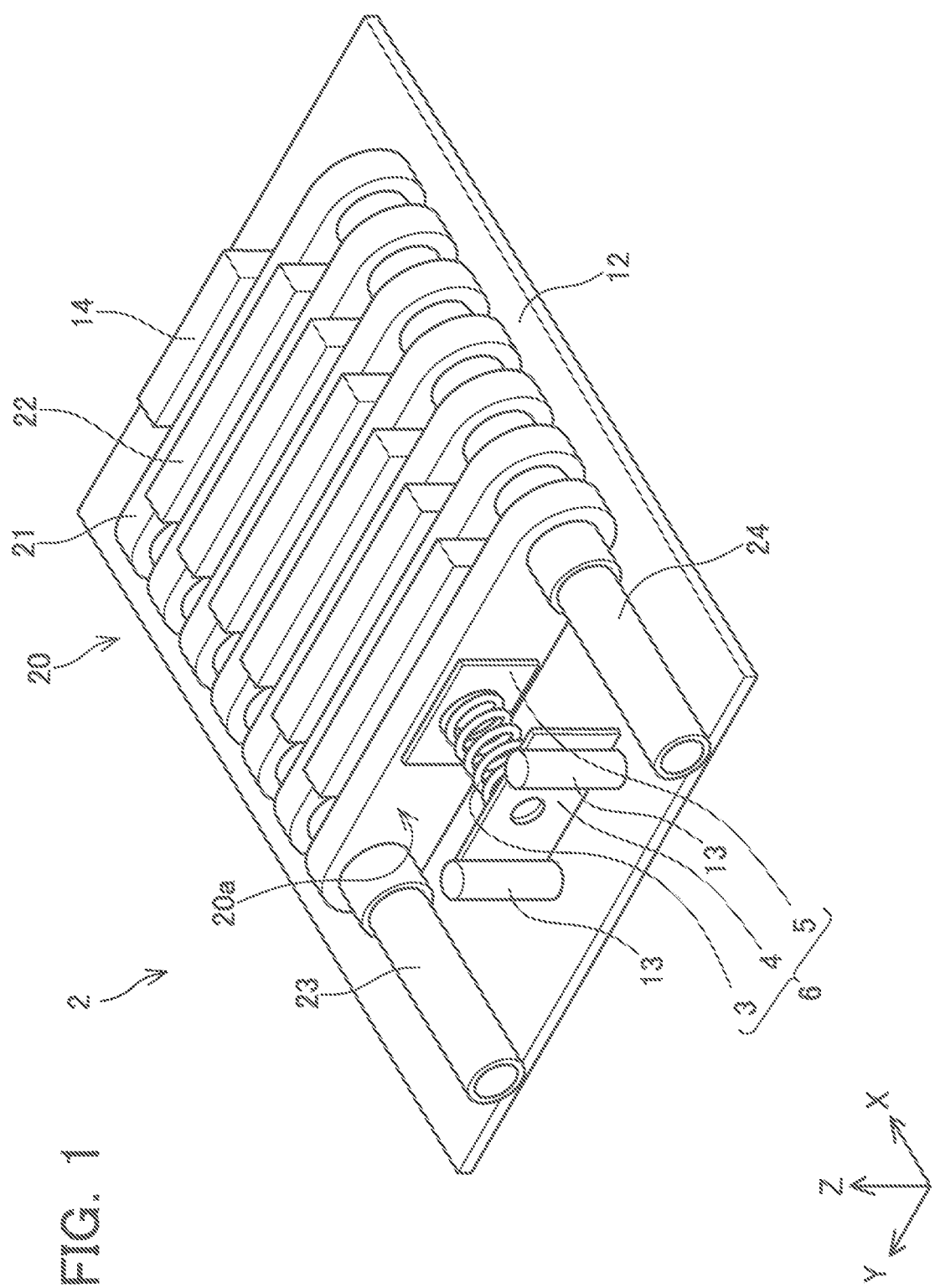
FIG. 1 is a perspective view of an electric power converter.

An electric power converter of the embodiment will be described with reference to the drawings. The electric power converter of the embodiment is an inverter that supplies AC power to a motor. FIG. 1 shows a perspective view of an inverter 2. Moreover, in addition to a semiconductor stacking unit 20 in which power semiconductor elements such as IGBTs or diodes which are used in a switching circuit are stacked, the inverter 2 has a circuit for generating a PWM for driving the power semiconductor element, a circuit for smoothing current, a housing etc., but illustration and description thereof will be omitted.

Since power semiconductor elements create a large amount of heat, the power semiconductor elements are integrated separately from other circuit components, and are cooled intensively. The inverter 2 utilizes a plurality of power semiconductor elements. The plurality of power semiconductor elements is packaged such that several power semiconductor elements am each in a flat type resin mold. Each package is called a semiconductor module 22. The semiconductor stacking unit 20 has a configuration in which the semiconductor modules 22 and flat type coolers 21 are alternately stacked. In the semiconductor stacking unit 20 of FIG. 1, six semiconductor modules 22 and seven coolers 21 are stacked alternately. Grease is applied to contact surfaces of the semiconductor modules 22 and the coolers 21. The coolers 21 are connected to one another by pipes. Refrigerant supplied from a supply pipe 24 passes through the coolers 21, and is discharged from a discharge pipe 23. Each of the semiconductor modules 22 is cooled efficiently from both surfaces. Further, because the semiconductor stacking unit 20 has a stacked structure, it has good compactness.

The semiconductor stacking unit 20 is fixed to a frame 12. The frame 12 is further housed in a housing (not shown) of the inverter 2. The semiconductor stacking unit 20 is fixed between a facing wall 14 and supports 13 provided on the frame 12. A spring unit 6 is utilized in fixing the semiconductor stacking unit 20. The spring unit 6 is inserted between one end surface 20a of the semiconductor stacking unit 20 and the supports 13 of the frame 12, and applies pressure to the semiconductor stacking unit 20 in a stacking direction of the semiconductor stacking unit 20. As described above, grease is applied to the contact surfaces of the semiconductor modules 22 and the coolers 21. By applying pressure to the semiconductor stacking unit 20, the adhesion of the semiconductor modules 22, and the coolers 21 increases, improving thermal conductivity from the semiconductor modules 22 to the coolers 21. That is cooling efficiency is improved by applying pressure to the semiconductor stacking unit 20 in the stacking direction.

Figure 2:
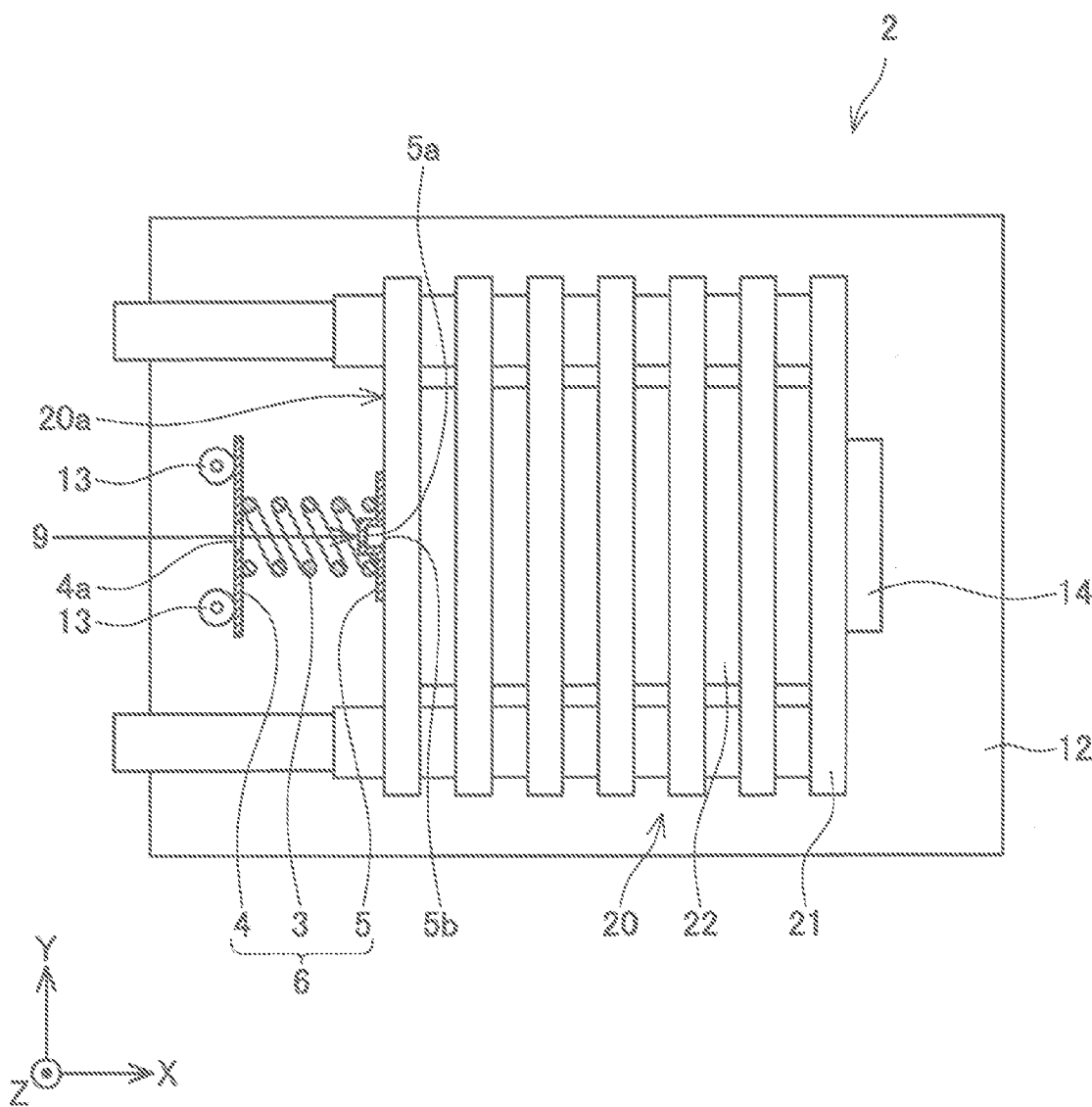
FIG. 2 is a plan view of the electric power converter.
Figure 3:
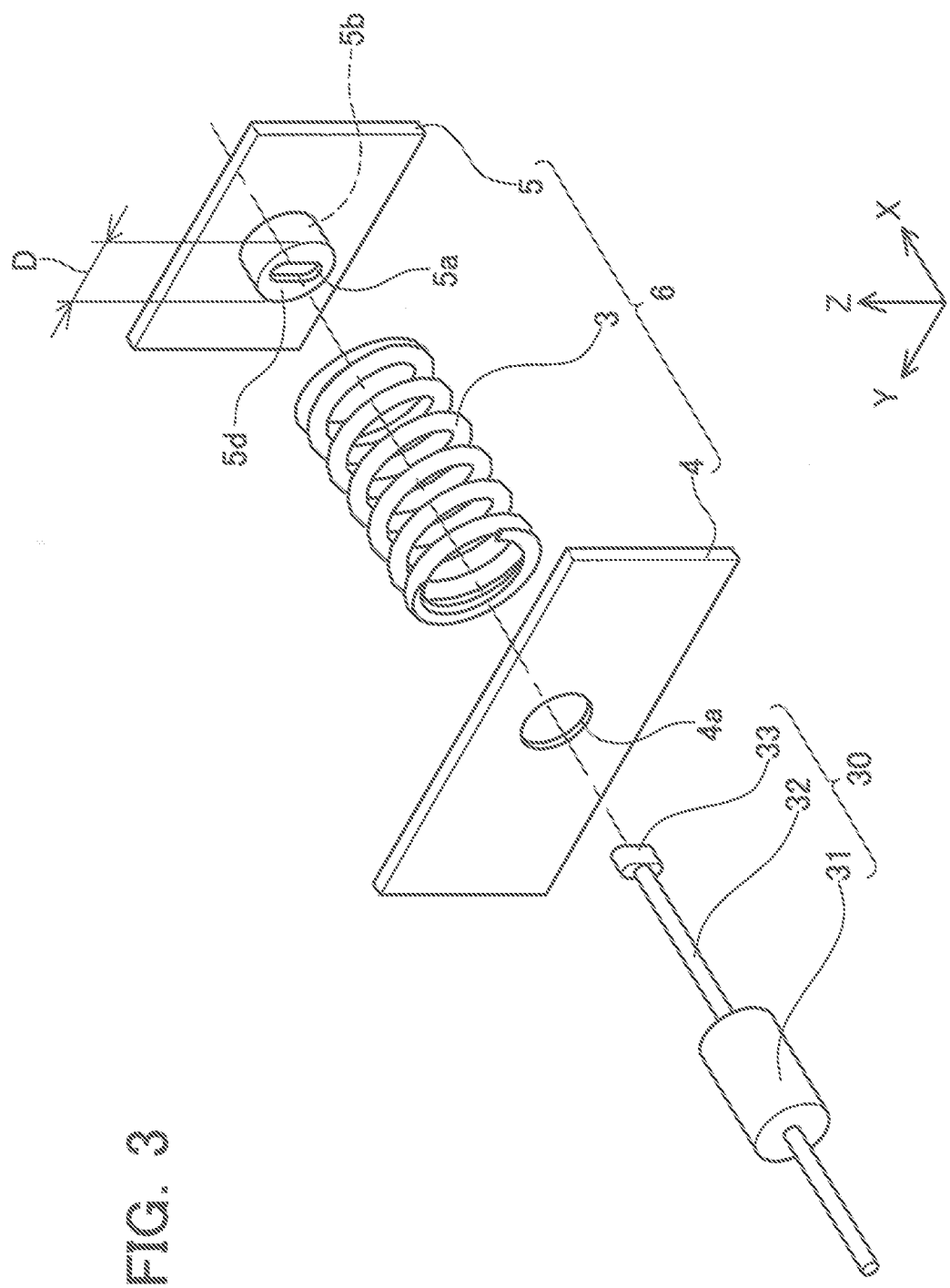
FIG. 3 is an exploded view of a spring unit.

The inverter 2 is characterized by the spring unit 6. A plan view of the inverter 2 is shown in FIG. 2, and an exploded perspective view of the spring unit 6 is shown in FIG. 3. Moreover, a cross-section along an XY plane of the spring unit 6 is depicted in FIG. 2. The same applies to the plan views of FIG. 4 to FIG. 8. The spring unit 6 is configured by two plates (first plate 5 and second plate 4), and a coil spring 3 sandwiched between the two plates. The first plate 5 contacts with the one end surface 20a of the semiconductor stacking unit 20, and the second plate 4 contacts with the supports 13 fixed on the frame 12. A recess 5b is provided at approximately the center of the first plate 5 so as to have a gap between the first plate 5 and the end surface 20a of the semiconductor stacking unit 20. Viewed from a rear surface of the first plate 5, a diameter D (see FIG. 3) of a protruding portion 5d corresponding to the recess 5b is of a size to fit the coil spring 3. An elliptical hole 5a is provided in a bottom of the recess 5b. On the other hand, a central hole 4a is provided in the second plate 4. A penetrating passage 9 is formed in the spring unit 6 from the central hole 4a of the second plate 4, along an inside of the coil spring 3, and reaching the elliptical hole 5a of the first plate 5 (see FIG. 2, FIG. 3). The elliptical hole 5a of the first plate 5 corresponds to one opening of the penetrating passage 9, and the central hole 4a of the second plate 4 corresponds to another opening of the penetrating passage 9. As shown in FIG. 3, the penetrating passage 9 is provided to allow passing a lock pin 30 having a hook 33 at a tip of the lock pin 30. The lock pin 30 is a tool for holding the spring unit 6 in the compressed state. By using the lock pin 30, the load of the mounting operation of the spring unit 6 is reduced. Next, an assembly step of the inverter 2 (a mounting step of the semiconductor stacking unit 20) using the lock pin 30 will be described.

The lock pin 30 is configured by a rod 32 at a tip of which the hook 33 is formed, and a stopper 31 which is slidably attached to the rod. The stopper 31 can be switched by a mechanism (not shown) between a state of being fixed to the rod 32 and a state of sliding relative to the rod 32. The shape of the hook 3 is substantially the same shape as the elliptical hole 5a provided in the first plate 5 of the spring unit 6.

Figure 4:
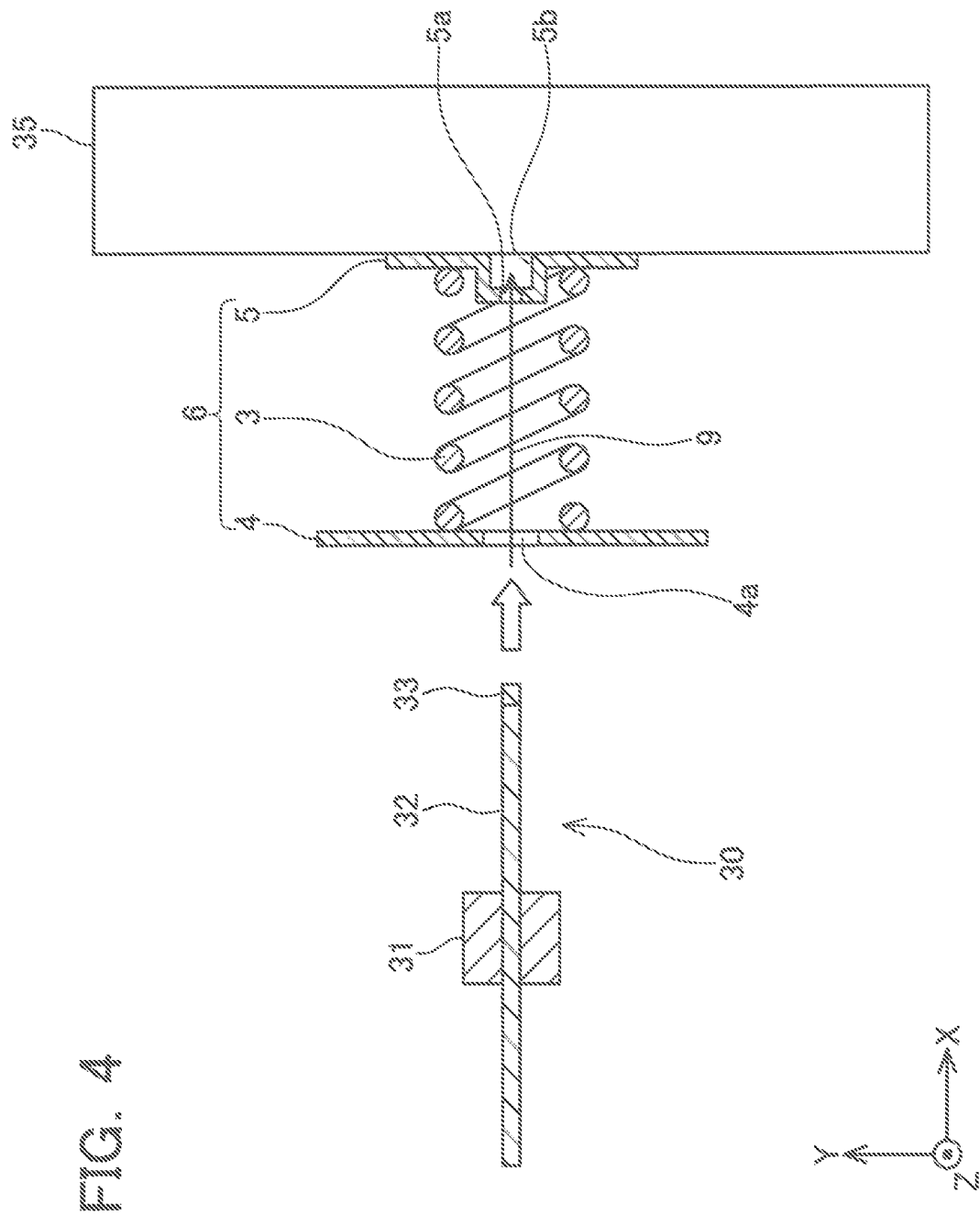
FIG. 4 is a cross-sectional view of the spring unit (before compression)

(First Step) This step is a step in which the lock pin 30 is inserted into the penetrating passage 9 from a second plate side, the spring unit 6 is compressed, and the hook 33 of the lock pin 30 engages an edge of an opening (the elliptical hole 5a) of a penetrating passage of the first plate 5, holding the spring unit 6 in the compressed state. FIG. 4 shows a cross-sectional view of the spring unit 6 before compression. Reference number 35 indicates a jig utilized for compressing the spring unit 6. The jig 35 is applied to the first plate 5 of the spring unit 6, inserting the lock pin 30 into the penetrating passage 9 from the second plate 4 side. The stopper 31 is larger than the central hole 4a, and therefore when the lock pin 30 is pushed, the stopper 31 pushes the second plate 4 and the spring unit 6 (the coil spring 3) is compressed.

Figure 5:
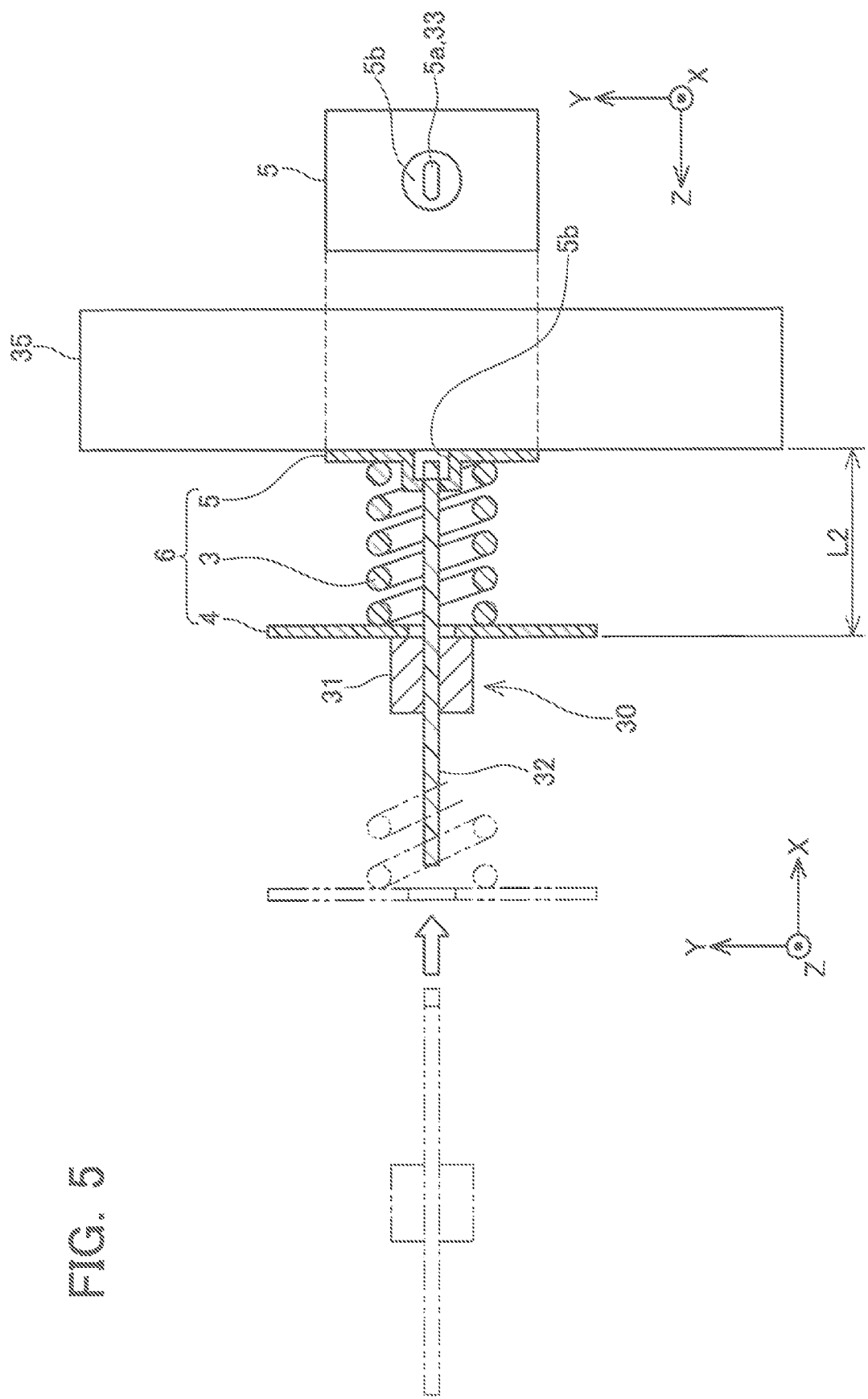
FIG. 5 is a cross-sectional view of the spring unit (compressed state)

FIG. 5 shows a state in which the lock pin 30 has been pushed until the hook 33 of the lock pin 30 has passed through the elliptical hole 5a of the first plate 5. The virtual line of FIG. 5 shows the lock pin in an initial position, and a part of the second plate and coil spring prior to being pushed in this state, the spring unit 6 is compressed until length L2. As shown in FIG. 5, the hook 33 is positioned in the recess 5b provided in the first plate 5, and does not protrude forwardly beyond the first plate 5. That is, by providing the recess 5b, the hook 33 does not interfere when the spring unit 6 is brought into contact with the end surface 20a of the semiconductor stacking unit 20. Moreover, this length 12 is shorter than a gap width L1 (see FIG. 7) when the semiconductor stacking unit 20 has been mounted on the frame 12. The right figure of FIG. 5 is a figure of the first plate 5 viewed from the X direction. The hook 33 and the elliptical hole 5a appear to overlap.

Figure 6:
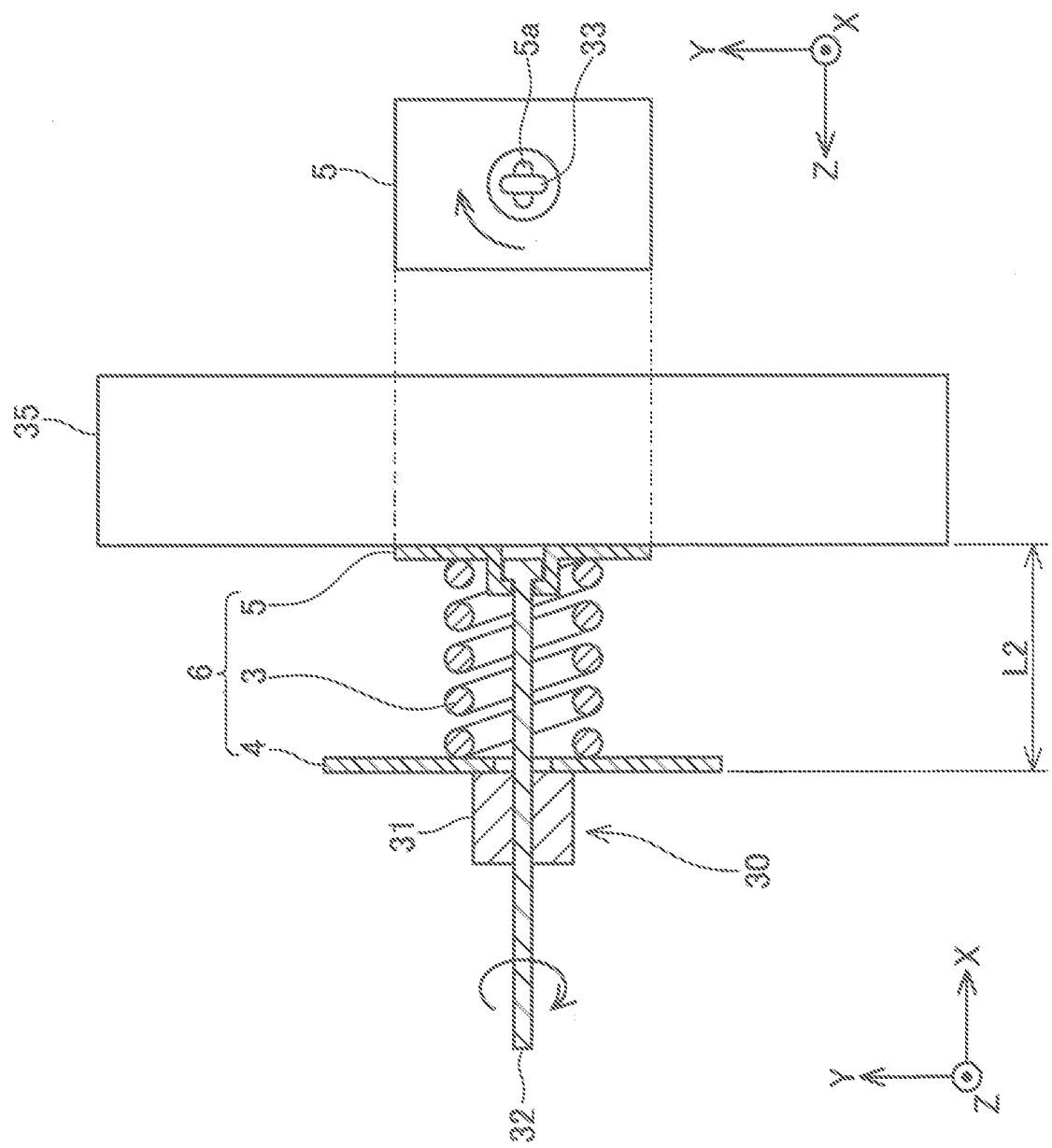
FIG. 6 is a cross-sectional view of the spring unit to (locked state)

Next, the lock pin 30 is rotated. In FIG. 6, the lock pin 30 is shown in a state of having been rotated by 90 degrees. As shown at the right figure of FIG. 6, the hook 33 engages the edge of the elliptical hole 5a of the first plate 5, so the lock pin 30 does not come out. That is the spring unit 6 is held in the compressed state.

Figure 7:
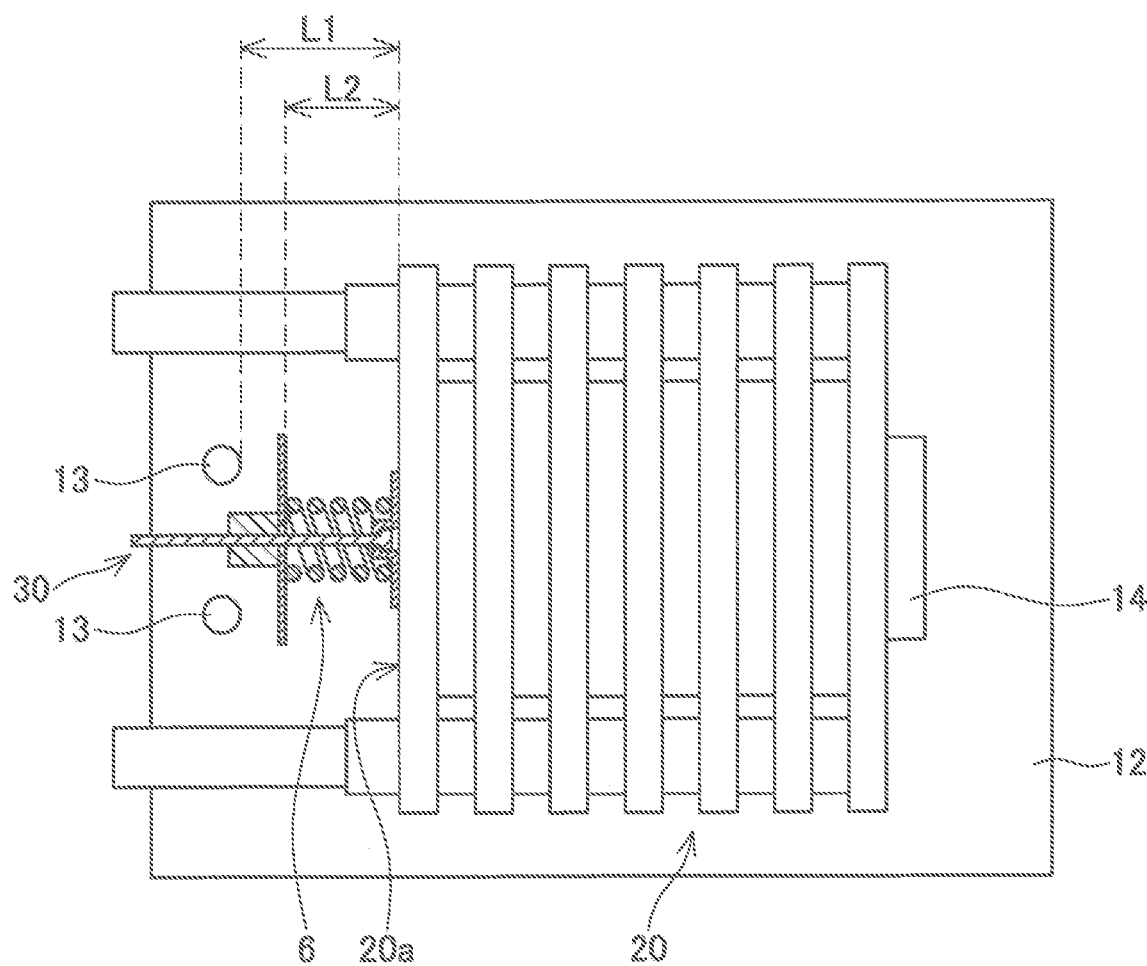
FIG. 7 shows a semiconductor stacking unit and the spring unit in a state of being set on a frame.

(Second Step) This step is a step in which the semiconductor stacking unit 20 and the spring unit 6 which is in the compressed state are disposed on the frame 12. FIG. 7 shows a plan view when the semiconductor stacking unit 20 and the spring unit 6 are disposed on the frame 12. The semiconductor stacking unit 20 is positioned between the wall 14 and the supports 13 of the frame 12. Next, the spring unit 6 is inserted between the semiconductor stacking unit 20 and the supports 13. As described above, since the length L2 of the compressed spring unit 6 is shorter than the gap width L1 between the end surface 20a of the semiconductor stacking unit 20 and the supports 13, the spring unit 6 can easily be inserted.

(Third Step) This step is a step in which the lock pin 30 is disengaged, releasing the spring unit 6, thus applying pressure to the semiconductor stacking unit 20, fixing the semiconductor stacking unit 20 to the frame 12. As described above, the stopper 31 of the lock pin 30 can slide relative to the rod 32. First, the stopper 31 is released from the rod 32.

Figure 8:
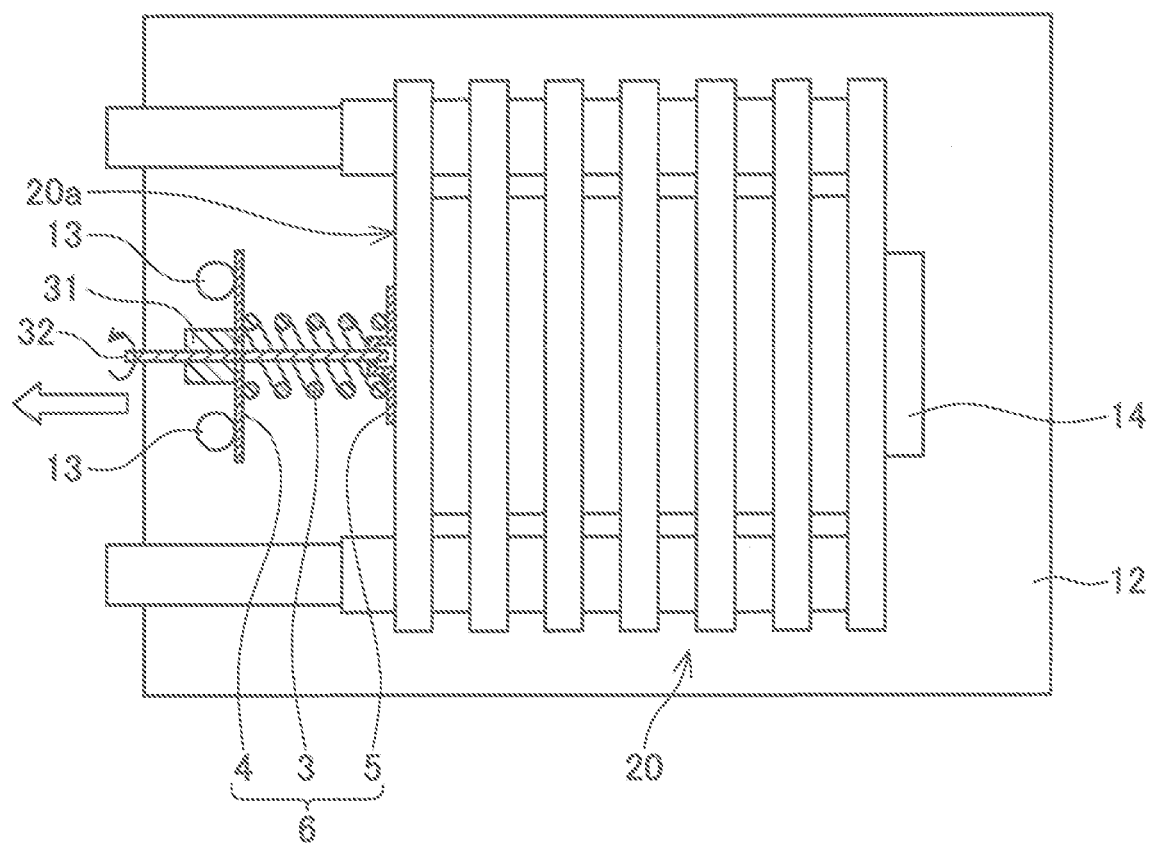
FIG. 8 shows a spring released state.

Thereupon, the stopper 31 slides back by being pushed by the coil spring 3 via the second plate 4. FIG. 8 shows the spring unit 6 in a released state. As shown in FIG. 8, the stopper 31 slides back compared to FIG. 7. Moreover, a damper is incorporated in the stopper 31, and the stopper 31 slides back slowly when pushed by the coil spring 3. The second plate 4 also slides back together with the stopper 31. When the second plate 4 contacts with the supports 13, the semiconductor stacking unit 20 receives pressure from the spring unit 6 between the supports 13 and the wall 14. Finally, the rod 32 is reversed by 90 degrees, releasing the engagement of the hook 33, and the lock pin 30 is disconnected from the spring unit 6 (see FIG. 8). Thus, the semiconductor stacking unit 20 is fixed to the frame 12.

Advantages of the inverter 2 (electric power converter) and the method of manufacturing thereof of the embodiment will be described. The spring unit 6 which applies pressure to the semiconductor stacking unit 20 has the recess 5b and the elliptical hole 5a in the first plate 5 that contacts with the semiconductor stacking unit 20. By providing the recess 5l, the spring unit 6 can be held in the compressed state by the lock pin 30 without the hook 33 extending forwardly beyond the first plate 5. Therefore, the spring unit 6 can be inserted between the supports 13 and the semiconductor stacking unit 20 while being held in the compressed state by the lock pin 30. Further, after the compressed spring unit 6 has been positioned so as to face the end surface 20a of the semiconductor stacking unit 20, the first plate 5 can uniformly push the semiconductor stacking unit 20 by releasing the lock of the spring unit 6. Therefore, the semiconductor modules 22 and the coolers 21 can be made to adhere uniformly. Moreover, providing the stopper 31 of the lock pin 30 with the damper also contributes to uniformly pressing the semiconductor stacking unit 20. Transient pressure that is generated in the course of beginning to open the spring can be absorbed (by the stopper into which the damper is incorporated retracting slowly when pushed by the coil spring), preventing damage to the coolers and the structure the grease). Further, the lock pin 30 can be utilized repeatedly.

Further, the spring unit 6 utilizes the lock pin 30 having the hook 33 without utilizing a bolt or screw to hold the spring unit 6 in the compressed state. There is a possibility, when a bolt is utilized, of generating dust from the screw hole when the bolt is disengaged. Due to not utilizing a bolt or screw, the technique of the present embodiment can suppress the generation of dust.

Figure 9:
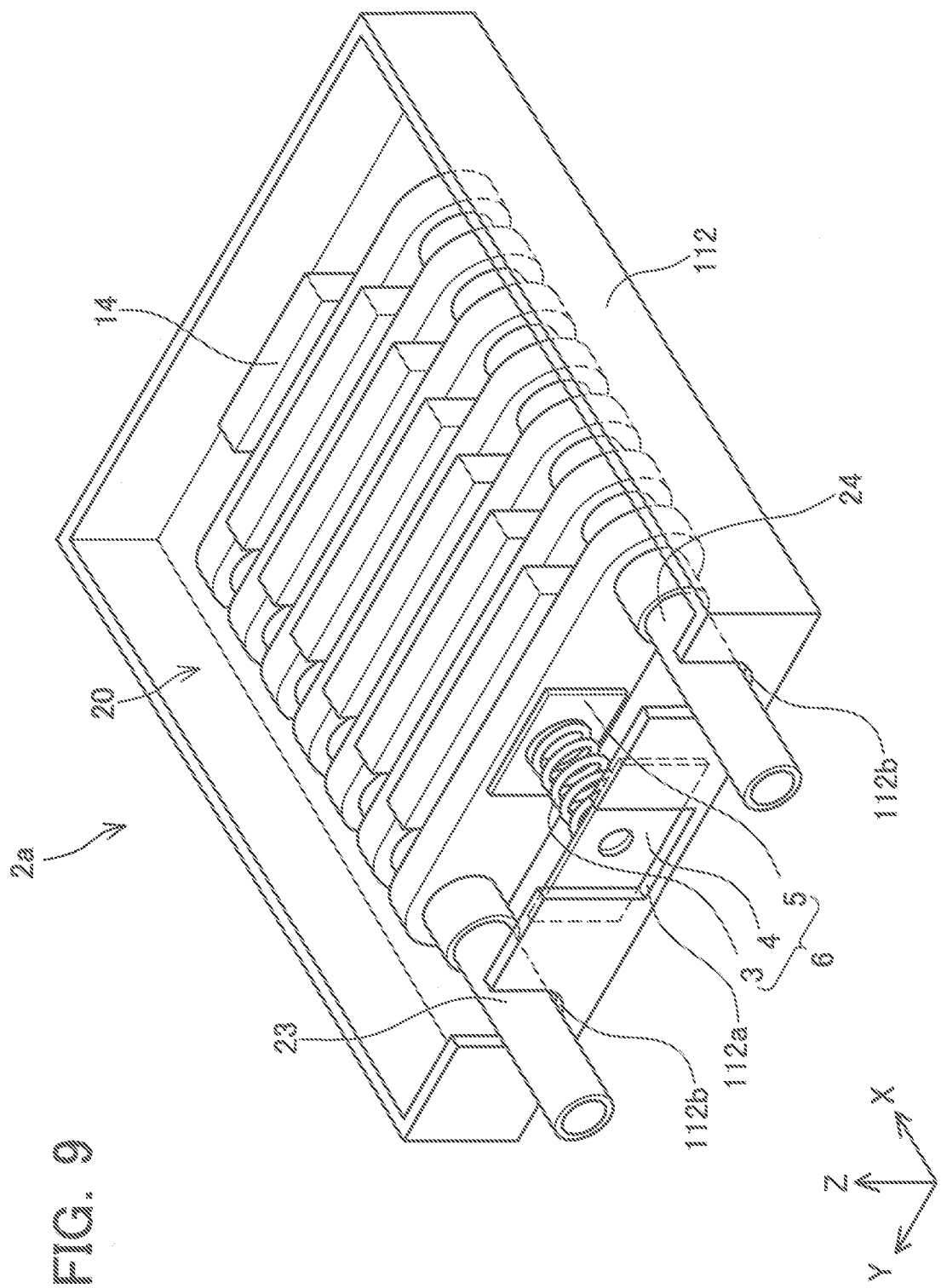
FIG. 9 is a perspective view of a variant electric power converter.

Next, a variant will be described. FIG. 9 shows a perspective view of an inverter 2a (electric power converter) of a variant. In the inverter 2a, a housing 112 corresponds to a frame. Three slits 112a, 112b are provided in one side surface of the housing 112. The slits 112b are slits for leading the supply pipe 24 and the discharge pipe 23 of the refrigerant to the exterior of the housing. The slit 112a is provided to ensure space for the lock pin inserted into the spring unit 6 when placing the semiconductor stacking unit 20. As clearly shown in FIG. 9, side edges of the slit 112a correspond to the supports 13 in the inverter 2 of FIG. 1. The second plate 4 engages with the side edges of the slit 112a. The inverter 2a also exhibits the same effects as the inverter 2 described above.

Figure 10:
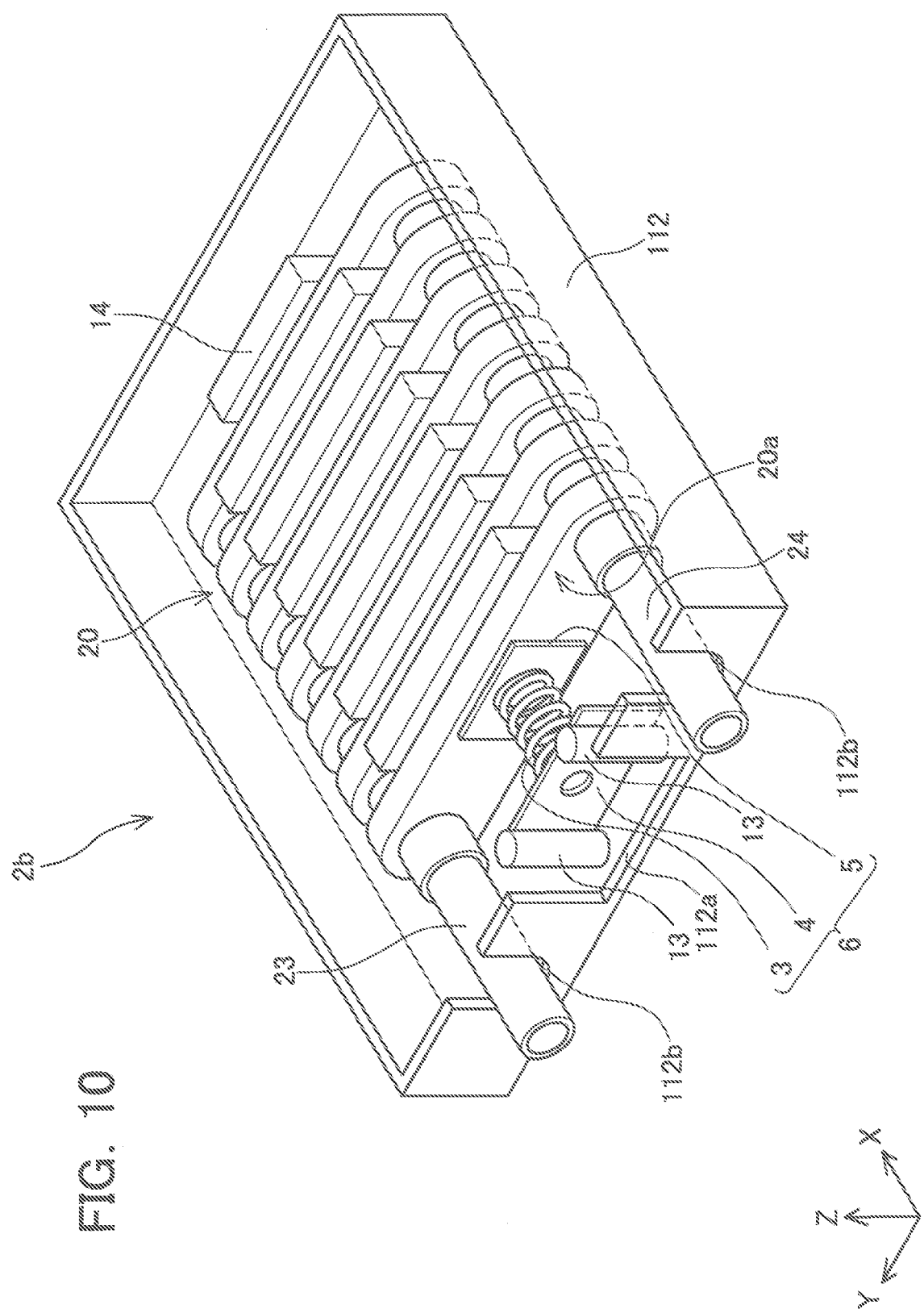
FIG. 10 is a perspective view of another variant electric power converter.

FIG. 10 shows a perspective view of an inverter 2b (electric power converter) of another variant. The inverter 2b is equivalent to an inverter obtained by replacing the frame 12 in the inverter 2 of FIG. 1 with the housing 112. The spring unit 6 is inserted between the supports 13 and the one end surface 20a of the semiconductor stacking unit 20. The housing 112 is equivalent to the frame. The three slits 112a, 112b are provided in one side surface of the housing 112. The slits 1121 are slits for leading the supply pipe 24 and the discharge pipe 23 of the refrigerant to the exterior of the housing. The slit 112a is provided to ensure space for removing the lock pin inserted into the spring unit 6 when placing the semiconductor stacking unit 20. The inverter 2b also exhibits the same effects as the inverter 2 described above.

Considerations relating to the technique of the embodiment will be described. The spring unit 6 of the embodiment employed the coil spring 3. The spring utilized in the spring unit 6 is not limited to a coil spring. For example, the spring may be a flat spring having a hole in the center. The center hole is equivalent to the opening of the penetrating passage that penetrates the spring unit. The inverters 2, 2a of the embodiment are equivalent to an example of an electric power converter. The technique disclosed in the present specification may also be applied to another type of electric power converter, such as a voltage converter.

Representative, non-limiting examples of the present inventions have been described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved power conversion apparatuses and method of manufacturing the same.

Moreover, combinations of features and steps disclosed in the above detailed description may not be necessary to practice the invention in the broadest sense, and are instead taught merely to particularly describe representative examples of the invention. Furthermore, various features of the above-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. An electric power converter comprising:
    a semiconductor stacking unit configured to alternately stack a flat type semiconductor module and a flat type cooler, the semiconductor module containing a semiconductor element;
    a frame for placing the semiconductor stacking unit; and
    a spring unit that applies pressure to the semiconductor unit, the spring unit being inserted between an end surface of the semiconductor unit in a stacking direction and a wall or a support provided on the frame;
    wherein the spring unit comprises:
        a first plate that contacts with the end surface of the semiconductor stacking unit and has a recess which forms a gap between the end surface of the semiconductor stacking unit and the first plate;
        a second plate that contacts with the wall or the support provided on the frame;
        a spring sandwiched between the first and second plates; and
        a penetrating passage that penetrates an entirety of the spring unit while passing through a bottom of the recess.

2. The electric power converter of claim 1, wherein the frame is a housing for containing the semiconductor stacking unit.

3. The electric power converter of claim 1, wherein the spring is a coil spring.

4. A method of manufacturing the electric power converter of claim 1, the method comprising:
    inserting a lock pin into the penetrating passage from a second plate side, the lock pin having a hook at a tip of the lock pin;
    compressing the spring unit;
    holding the spring unit in a compressed state by engaging the hook at an edge of an opening of the penetrating passage;
    placing the semiconductor stacking unit on the frame and placing the compressed spring unit between the wall or the support provided on the frame and the end surface of the semiconductor stacking unit; and
    releasing the spring unit by disengaging the lock pin to apply pressure to the semiconductor unit and fix the semiconductor stacking unit.

* * * * *